United States Patent [19]

Takahashi et al.

[11] Patent Number: 4,996,475

[45] Date of Patent: Feb. 26, 1991

[54] ELECTRO-OPTIC VOLTAGE DETECTOR HAVING A TRANSPARENT ELECTRODE

[75] Inventors: Hironori Takahashi; Shinichiro Aoshima; Yutaka Tsuchiya, all of Shizuoka, Japan

[73] Assignee: Hamamatsu Photonics Kabushiki Kaisha, Shizuoka, Japan

[21] Appl. No.: 200,575

[22] Filed: May 31, 1988

[30] Foreign Application Priority Data

May 31, 1987 [JP] Japan ................................. 62-137055
Jun. 5, 1987 [JP] Japan ................................. 62-142062

[51] Int. Cl.$^5$ ............................................ G01R 31/00
[52] U.S. Cl. .................................. 324/96; 324/77 K
[58] Field of Search ............................... 324/96, 77 K; 350/276 SL, 356, 371; 455/611

[56] References Cited

U.S. PATENT DOCUMENTS

| | | | |
|---|---|---|---|
| 4,112,361 | 9/1978 | Nakada et al. | 324/96 |
| 4,123,591 | 10/1978 | Karki | 350/276 SL |
| 4,253,061 | 2/1981 | Toshiharu et al. | 324/96 |
| 4,446,425 | 5/1984 | Valdmanis et al. | 324/77 K |
| 4,603,293 | 7/1986 | Mourou et al. | 324/96 |
| 4,618,819 | 10/1986 | Mourou et al. | 324/77 K |

FOREIGN PATENT DOCUMENTS 0197196 10/1986 European Pat. Off. .
3326555A1 2/1984 Fed. Rep. of Germany .

OTHER PUBLICATIONS

Densmore et al., "Visual Voltage Detection System" 6/74 IBM Technical Disclosure Bul. vol. 17 No. p. 98.
Valdmanis, J. A. et al., "Electro-Optic Sampling: Testing Picosecond Electronics Part 1. Principles and Embodiments", Laser Focus/Electro-Optics, pp. 84-96, Feb. 1986.
Valdmanis, J. A. et al., "Electro-Optic Sampling: Testing Picosecond Electronics Part 2. Applications", Laser Focus/Electro-Optics, pp. 96-106, Mar. 1986.
Valdmanis, J. A. et al., "Subpicosecond Electrical Sampling and Applications", Picosecond Optoelectronic Devices, pp. 249-270, 1984.
Williamson, S. et al., "Picosecond Electro-Electron Optic Oscilloscope", Proc. Conf. Picosecond Electron. Optoelectron., pp. 58-61, (N.Y. Springer-Verlag), 1985.
Kolner, B. H. et al., "Electrooptic Sampling in GaAs Integrated Circuits", IEEE Journal of Quantum Electronics, vol. qe-22, pp. 79-93, Jan. 1987.
Nees, J. et al., "Noncontact Electro-Optic Sampling with a GaAs Injection Laser", Electronics Letters, vol. 22, No. 17, pp. 918-919, Aug. 1986.
Valdmanis, J. A. et al., "A Non-Contact Electro-Optic Prober for High Speed Integrated Circuits", Extended Abstracts, vol. 87, No. 1, pp. 181-182, Philadelphia, Pa., U.S.A., (Spring) 1987.
Sumitomo Denki Kogyo K.K. et al., "Light-Applying Voltage and Electric Field Sensor", Patent Abstracts of Japan, vol. 6, No. 41, Mar. 1982.

(List continued on next page.)

*Primary Examiner*—Reinhard J. Eisenzopf
*Assistant Examiner*—Edward Urban
*Attorney, Agent, or Firm*—Finnegan, Henderson, Farabow, Garrett, and Dunner

[57] ABSTRACT

A voltage detector detects a voltage developing in a selected area of an object such as an integrated circuit by utilizing an electro-optic material equipped in an optical probe. A change in refractive index of the electro-optic material which is caused by the voltage in the object, is detected as a change of polarization of a light beam passing through the electro-optic material. In order to accomplish precise detection of the voltage, a mirror in the form of a thin metal film or a multilayered dielectric film is disposed at the tip of electro-optic material and, at the same time, a transparent electrode is disposed on the side of electro-optic material opposite to the side where the mirror is disposed. As a result, lines of electric force produced by the voltage developing in the object are aligned in the electro-optic material parallel to the center line of the optical probe and the change in refractive index becomes uniform.

8 Claims, 3 Drawing Sheets

OTHER PUBLICATIONS

Kolner, B. H. et al., "Electro-optic Sampling with Picosecond Resolution", Electronics Letters, vol. 19, No. 15, pp. 574–575, Jul. 1983.

Tsuchiya, Y., "Advances in Streak Camera Instrumentation for the Study of Biological and Physical Processes", IEEE Journal of Quantum Electronics, vol. qe-20, No. 12, pp. 1516–1528, Dec. 1984.

Valdmanis, J. A., "High-Speed Optical Electronics: The Picosecond Optical Oscilloscope", Solid State Technology/Test and Measurement World, pp. S40–S44, Nov. 1986.

Valdmanis, J. A. et al., "Subpicosecond Electrooptic Sampling: Principles and Applications", IEEE Journal of Quantum Electronics, vol. qe-22, No. 1, pp. 69–78, Jan. 1986.

Valdmanis, J. A. et al., "Picosecond Electrooptic Sampling System", Appl. Phys. Lett., vol. 41, No. 3, pp. 211–212, Aug. 1982.

Valdmanis, J. A. et al., "Subpicosecond Electrical Sampling", IEEE Journal of Quantum Electronics, vol. qe-19, No. 4, pp. 664–667, Apr. 1983.

ELECTRO-OPTIC VOLTAGE DETECTOR HAVING A TRANSPARENT ELECTRODE

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong need exists in the art for detecting such rapidly changing voltage with high precision without affecting the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed to that. In addition, the area to be measured is prone to be damaged by electron beams.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent application No. 137317/1987 filed on May 30, 1987) that voltage be detected by making use of the polarization of a light beam that changes with the voltage developing in a selected area of an object to be measured.

A voltage detector operating on this principle is schematically shown in FIG. 5. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 via a condenser lens 60; an optical fiber 92 for guiding reference light from the optical probe 52 into a photoelectric converter 55 via a collimator 90; an optical fiber 93 for guiding output light from the optical probe 52 into a photoelectric converter 58 via a collimator 91; and a comparator circuit 61 for comparing the electric signals from the photoelectric converters 55 and 58.

The optical probe 52 is filled with an electro-optic material 62 such as an optically uniaxial crystal of lithium tantalate (LiTaO$_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 5 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The beam is polarized by the polarizer 54 and a predetermined polarized component having intensity I is launched into the electro-optic material 62 in the optical probe 52 via the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as the state of polarization of input light launched into that material will change in proportion to the difference between refractive indices for an ordinary ray and an extraordinary ray and to the length 2l as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4)\sin^2[(\pi/2)V/V_0]$ in the analyzer 57 before it is further fed into the photoelectric converter 58. In the formula expressing the intensity of output light emerging from the analyzer 57, V is the voltage developing in the object to be measured, and $V_0$ is a half-wave voltage.

In the comparator circuit 61, the intensity of reference light produced from the photoelectric converter 55, or I/2, is compared with the intensity of output light produced from the other photoelectric converter 58, or $(I/4)\sin^2[(\pi/2)V/V_0]$.

The intensity of output light, or $(I/4)\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 5, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions. If desired, a pulsive light source such as a laser diode that produces light pulses of a very small pulse width may be used as a light source to ensure that rapid changes in the voltage on the object to be measured are sampled at extremely short time intervals. Rapid changes in the voltage on the object of interest can be measured with a very high time resolution by using a CW light source and a quick-response detector such as a streak camera. Either method is capable of precision detection of rapid changes in voltage.

The voltage detector 50 shown in FIG. 5, however, has a problem that results from the fact that the conductive electrode 64 is provided on the circumference of the optical probe 52 and that this electrode is connected to a certain potential, say, the ground potential. As shown in FIG. 6, the lines of electric force ELN that are produced by the voltage developing in a selected area of the object 6, namely, difference between the potential induced in the thin metal film 65 and the ground potential to which the conductive electrode 64 is connected, do not run through the electro-optic material 62 in a direction parallel to the center line A—A of the optical probe 52 and instead are curved particularly significantly in the vicinity of the conductive electrode 64. As a result, the change that occurs in the refractive index of the electro-optic material 62 on account of the voltage developing in a selected area of the object 6 is not uniform throughout the material and the state of polarization of a light beam passing through said material will not change in a manner that is in exact correspondence to the change in the voltage developing in a selected area of the object 6, thereby making it practically impossible to accomplish correct detection of the voltage to be measured.

SUMMARY OF THE INVENTION

An object, therefore, of the present invention is to provide a voltage detector which ensures that the change that occurs in the refractive index of an electro-optic material on account of the voltage developing in a selected area of an object to be measured will be uniform throughout the material so as to accomplish correct detection of the voltage of interest.

This object of the present invention can be attained by a voltage detector of a type that employs an electro-optic material whose refractive index changes according to the voltage developing in a selected area of an object to be measured and which is characterized in that said electro-optic material is situated at a predetermined position in an optical probe, the tip of said electro-optic material being equipped with a reflection means for reflecting a light beam that is launched into said material along the center line of the optical probe, and said material being fitted with a transparent electrode on the side opposite to the side where said reflection means is provided.

According to the present invention, a reflection means, typically in the form of a thin metal film or a multilayered dielectric film, is disposed at the tip of an electro-optic material and, at the same time, a transparent electrode is disposed on the side of the electro-optic material opposite to the side where this reflection means is disposed. If the transparent electrode is set in such a way that its surface is perpendicular to the center line of an optical probe and if it is connected to a certain potential, say, the ground potential, the lines of electric force produced by the voltage developing in a selected area of an object to be measured will align in the electro-optic material parallel to the center line of the optical probe. As a result, the change that occurs in the refractive index of the electro-optic material will become uniform throughout the material and the state of polarization of a light beam passing through the material can be changed in a manner that is in exact correspondence to the change in the voltage developing in a selected area of the object being measured.

DETAILED DESCRIPTION OF THE PREFERRED EMBODIMENTS

Various embodiments of the present invention are described hereinafter with reference to the accompanying drawings.

Figure 1:
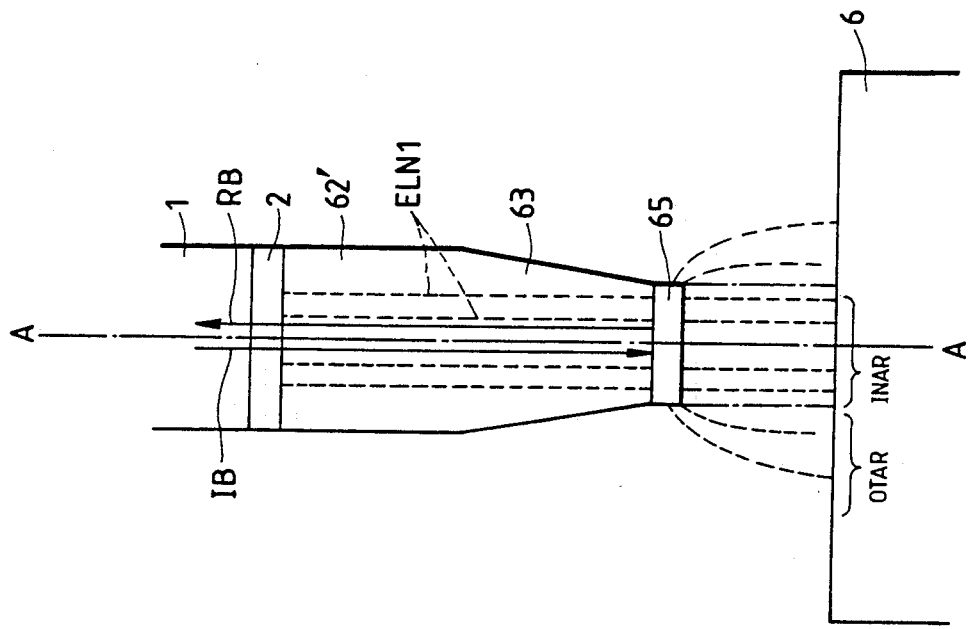
FIG. 1 is a diagram showing part of the composition of a voltage detector according to one embodiment of the present invention.

FIG. 1 is a diagram showing part of the composition of a voltage detector according to one embodiment of the present invention.

Figure 6:
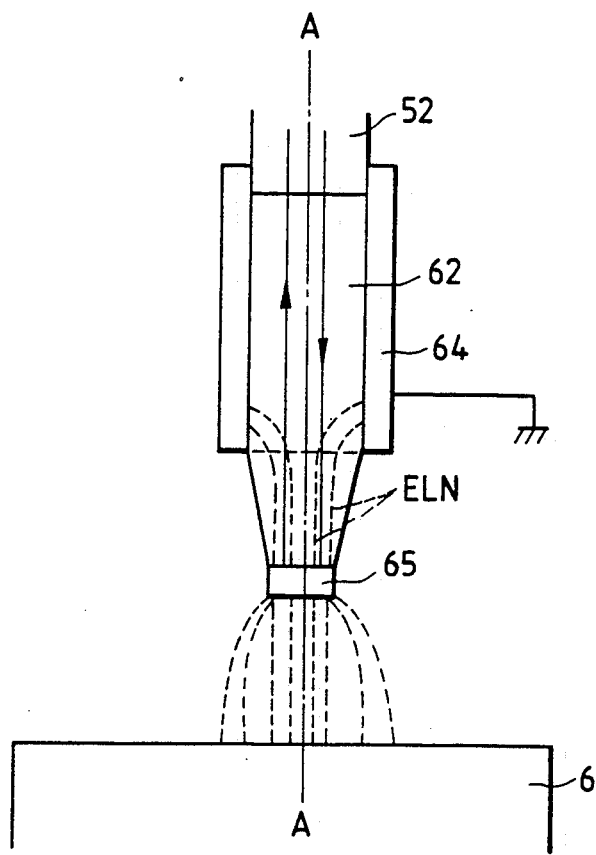
FIG. 6 is a diagram showing how lines of electric force are produced in an electro-optic material in the voltage detector shown in FIG. 5.

As in the case of the voltage detector shown in FIG. 6, the optical probe 1 of the voltage detector shown in FIG. 1 contains an electro-optic material 62' such as an optically uniaxial crystal of lithium tantalate ($LiTaO_3$) or lithium niobate ($LiNbO_3$), with its tip 63 being worked into a frustoconical shape. The tip 63 of the electro-optic material 62' is fitted with a reflection mirror 65 in the form of a thin metal film that causes an incident beam (IB) having a predetermined polarized component to be reflected as a return beam (RB). Besides reflecting the incident beam (IB), the reflection mirror 65 serves to induce the voltage originating from a selected area of the object to be measured.

The voltage detector shown in FIG. 1 differs from the one shown in FIG. 6 in that instead of the conductive electrode 64, a transparent electrode 2 whose surface is perpendicular to the center line A—A of the optical probe 1 is disposed on top of the electro-optic material 62'. The top surface of the transparent electrode 2 is provided with a vacuum-deposited anti-reflection coating. The transparent electrode 2 transmits both incident beam (IB) and return beam (RB) without causing any effect on these beams; at the same time, it enables the refractive index of the electro-optic material 62' to change uniformly on account of the voltage developing in a selected area of the object 6.

When the optical probe 1 of the voltage detector having the composition described above is brought close to the object 6, the voltage corresponding to that developing in a selected area of that object is induced at the reflection mirror 65 in thin metal film form. Stated more specifically, a potential due to the voltage developing in the area INAR of the object 6 which lies just below the reflection mirror 65 and also due to the voltage developing in the outer area OTAR is induced at said reflection mirror. If the transparent electrode 2 is connected to a certain potential, say, the ground potential, lines of electric force ELN1 will be produced in the electro-optic material 62' by virtue of the difference between the potential of the reflection mirror 65 and the ground potential to which the transparent electrode 2 is connected. As already mentioned, the surface of the transparent electrode 2 is perpendicular to the center line A—A of the optical probe 1 and, as is clear from FIG. 1, the transparent electrode 2 is positioned parallel to the reflection mirror 65, and therefore, the lines of electric force ELN1 created within the electro-optic material 62' are parallel to the center line A—A of that material. This allows the refractive index of the electro-optic material 62' to change uniformly across said material on account of the lines of electric force ELN1, and the polarized components of the two light beams, IB and RB, passing through the electro-optic material 62' will vary in exact correspondence to the voltage developing in a selected area of the object being measured, thereby allowing the precise detection of the voltage developing in a selected area of the object 6.

Figure 2:
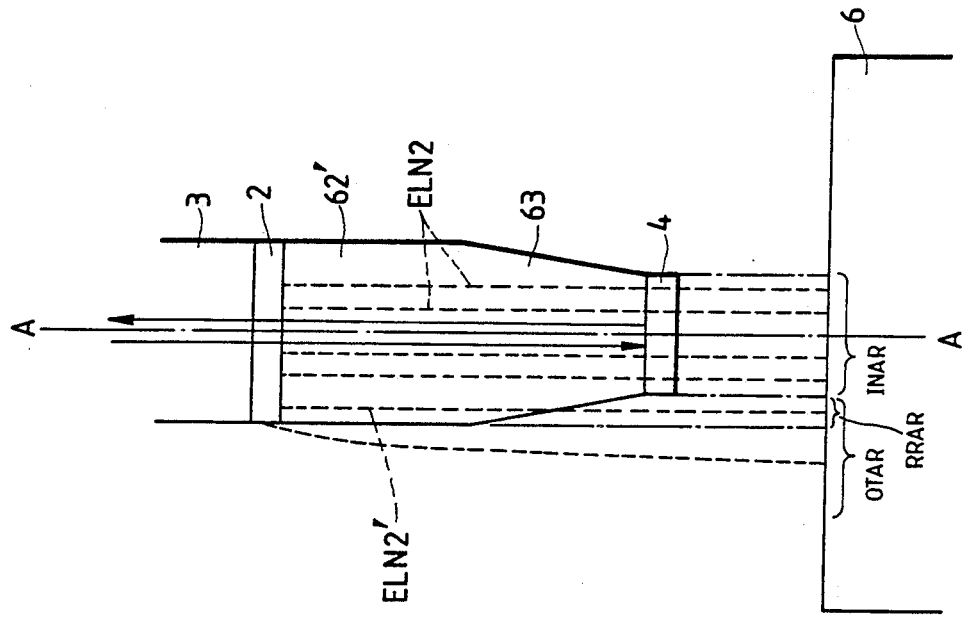
FIG. 2 is a diagram showing a modified version of the voltage detector shown in FIG. 1.

FIG. 2 shows a modified version of the voltage detector shown in FIG. 1. It differs from the previous embodiment in that the optical probe 3 has a mirror 4 in the form of a multilayered dielectric film at the tip 63 of the electro-optic material 62' instead of the reflection mirror 65 in thin metal film form. In the optical probe 1 shown in FIG. 1, the reflection mirror 65 in the form of a thin metal film is provided at the tip 63 of the electro-optic material 62', so the voltage induced at the reflection mirror 65 is not just the one corresponding to the voltage developing in the area INAR lying beneath the reflection mirror 65 and is also affected by the voltage developing in the outer area OTAR. Because of this additive effect, it has been difficult to correctly detect the voltage developing in a very limited area of the object of interest.

In the optical probe 3 shown in FIG. 2, the mirror 4 in the form of a multilayered dielectric film is provided at the tip 63 of the electro-optic material 62', so the lines of electric force produced by the voltage developing in a selected area of the object 6 will penetrate through the multilayered dielectric film 4 to reach the transparent electrode 2. By virtue of this effect, the refractive index of the electro-optic material 62' will change uniformly on account of both the lines of electric force ELN2 due to the voltage developing in the area INAR beneath the mirror 4 and the lines of electric force ELN2' due to the voltage developing in the area RRAR which accounts for a very small portion of the outer area OTAR. As a result, compared with the optical probe 1 shown in FIG. 1, the probe 3 has the advantage that voltage detection can be accomplished without being influenced by the voltage developing in the portion of OTAR which is located outside of the area RRAR. The effects of the area RRAR can also be eliminated if no light will pass through an area where lines of electric force are produced within the crystal of electro-optic material 62' by the area RRAR.

Figure 3:
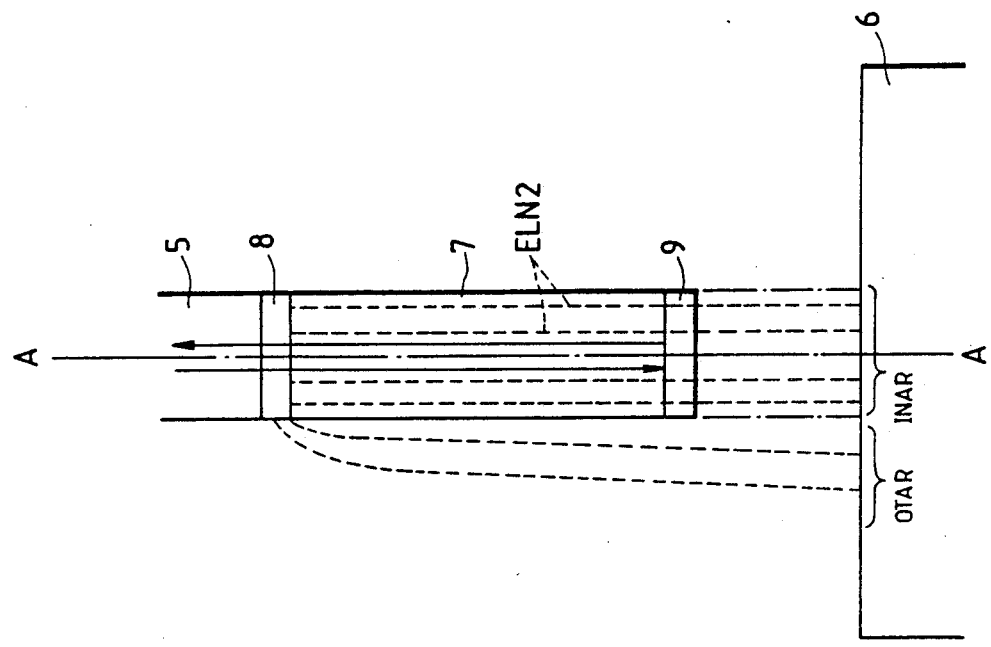
FIG. 3 is a diagram showing a modification of the voltage detector shown in FIG. 2.

FIG. 3 shows a modification of the voltage detector shown in FIG. 2. The optical probe 5 of the voltage detector shown in FIG. 3 employs an electro-optic material 7 having a uniform cross-sectional area and as in the case shown in FIG. 2, a transparent electrode 8 and a mirror 9 in the form of a multilayered dielectric film are provided at the top and bottom, respectively, of the electro-optic material 7. Naturally, the transparent electrode 8 and the mirror 9 are equal in cross-sectional area.

With the composition described above, only the lines of electric force ELN2 that are due to the voltage developing in the area INAR of object 6 lying just below the mirror 9 will be generated within the electro-optic material 7, and said material is not subject to any of the effects of the voltage developing in the outer area OTAR, thereby ensuring correct and selective detection of the voltage developing in the limited area INAR of the object 6.

Figure 4A:
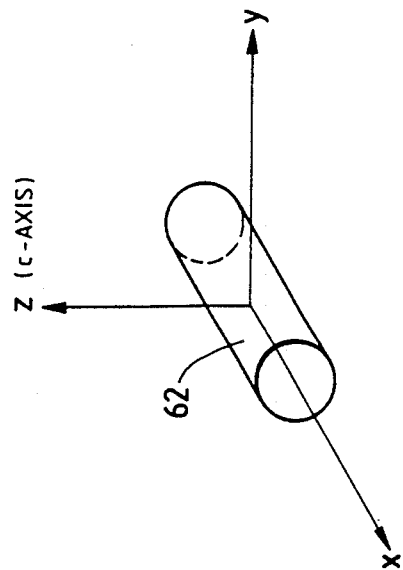
FIG. 4(a) is a sketch illustrating the case where an electro-optic material is cut through on a plane including c-axis.
Figure 4B:
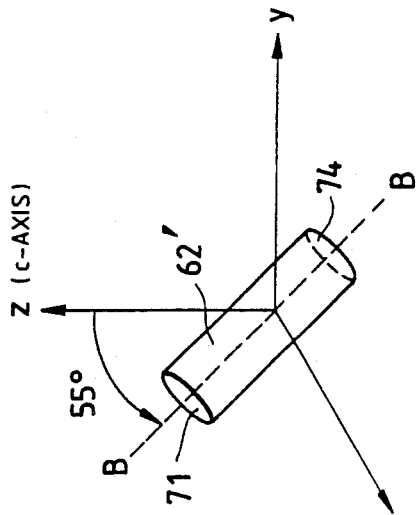
FIG. 4(b) is a sketch illustrating the case where an electro-optic material is cut through in a way that will cause a maximum change in the state of polarization of a light beam.
Figure 5:
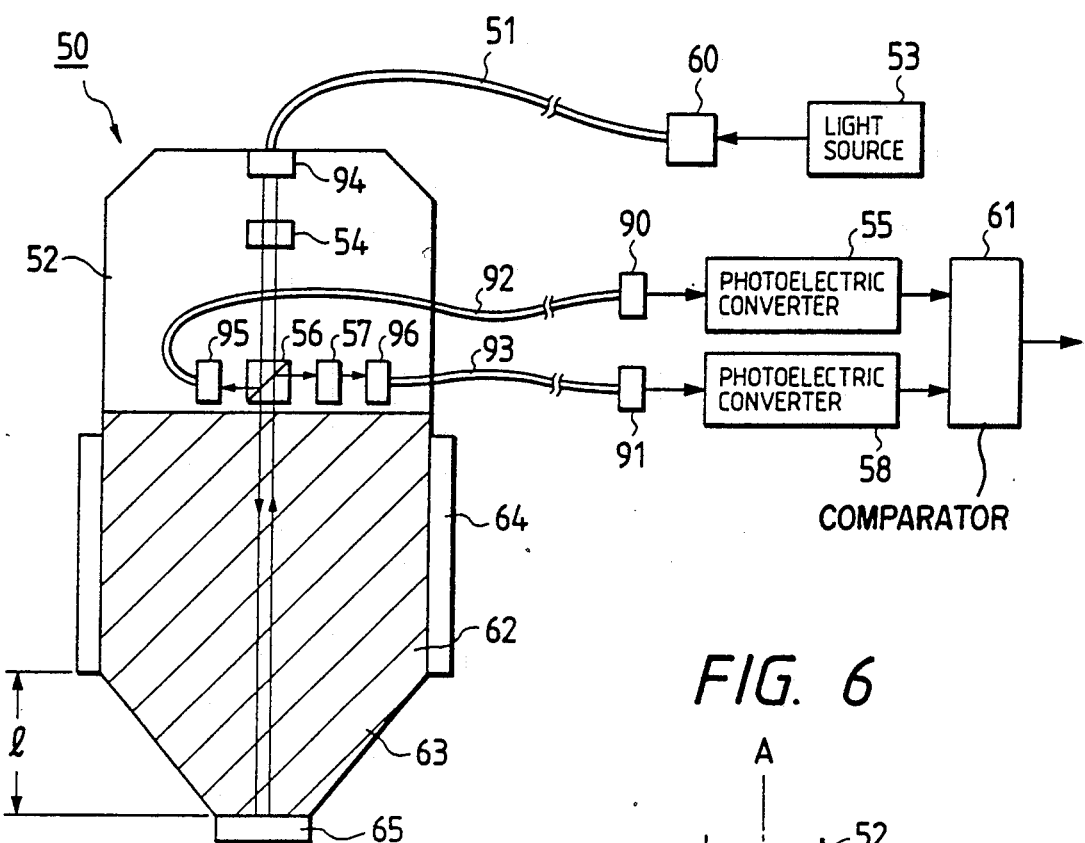
FIG. 5 is a diagram showing a known composition of a voltage detector.

With the voltage detector 50 shown in FIGS. 5 and 6, the electro-optic material 62 in the optical probe 52 is cut through on a plane including c-axis as shown in FIG. 4(a). The present inventors have observed that the electro-optic material cut in this way does not produce the best results in detection of the voltage on an object of interest by making use of the change in the state of polarization of a light beam, and that instead an increased half-wavelength voltage can be obtained. In order to ensure more sensitive voltage detection by utilizing the change in the state of polarization of a light beam, the cutting method shown in FIG. 4(b) is preferably employed; unlike the electro-optic material 62, the material 62' is cut in such a way that the top surface 71 and the bottom surface 74 of said material will be perpendicular to the diagonal line B—B of the crystal which is inclined by 55° from c-axis. In other words, good results can be obtained by bringing the direction of the diagonal line B—B into coincidence with that of the axial line A—A of the optical probe 52.

Therefore, the voltage developing in a selected area of an object to be measured can be detected with an even higher level of sensitivity by means of the voltage detectors shown in FIGS. 1, 2 and 3 if each of the electro-optic materials 62' and 7 is cut in such a way that the direction of 55° offset from the c-axis will coincide with the direction of the center line A—A of the optical probe 1, 3 or 5.

In the voltage detectors shown in FIGS. 1 to 3, part of the incident or return light beam might be scattered by being reflected from the surface of the optical probe 1, 3 or 5. Such scattering light will lower the precision of voltage detection and should desirably be eliminated. To this end, a coating of a suitable anti-reflection material such as an insulating black paint may be formed not only on the inner surface of a light-splitting and extracting part of the optical probe 1, 3 or 5 but also on the outer surface of the crystal of electro-optic material. If such an anti-reflection coating is formed, any part of the light incident upon the surface of the optical probe can be effectively absorbed to prevent the occurrence of light scattering, which hence contributes to precise voltage detection.

In all of the embodiments described above, the tip of the electro-optic material is brought close to the object to be measured, but not as close as to make contact with this object. If desired, the tip of the electro-optic material may be held in contact with the object of interest during voltage detection.

As described on the foregoing pages, the voltage detector of the present invention includes not only a reflection means but also a transparent electrode that is disposed on the side of an electro-optic material opposite to the side where the reflection means is provided. This composition allows the refractive index of the electro-optic material to vary uniformly throughout said material, and correct voltage detection can be accomplished by virtue of the exact correspondence achieved between the change in the polarized state of the light beam passing through said electro-optic material and the change in the voltage developing in a selected area of the object being measured.

What is claimed is:

1. A voltage detector for detecting a voltage developing in a selected area of an object to be measured, comprising:
    a light source for emitting a light beam;
    a voltage sensing part including an electro-optic material whose refractive index changes according to said voltage developing in said selected area of said object, a reflection means disposed on a first side surface of said electro-optic material for reflecting an input light beam, said reflection means being a mirror made of a multi-layered dialectric film, and a transparent electrode disposed on a second side surface of said electro-optic material opposite to said first side surface;
    splitting and extracting means for extracting a light beam with a first predetermined polarized component from a light beam introduced from said light source, said light beam being launched into said electro-optic material as said input light, and for extracting an output light beam with a second predetermined polarized component from an output light beam emerging from said electro-optic material after reflecting from said reflection means; and
    detection means for determining said voltage developing in said selected area of said object on the basis of intensity of said output light beam with said second predetermined polarized component.

2. A voltage detector as claimed in claim 1, wherein said splitting and extracting means further splits said light beam with said first predetermined polarized component into a reference light beam and said input light beam which is launched into said second electro-optic material; and
    said detection means determines said voltage on the basis of intensity of said reference light beam and intensity of said output light beam with said second predetermined polarized component.

3. A voltage detector as claimed in claim 1, wherein said transparent electrode is supplied with a ground potential.

4. A voltage detector as claimed in claim 1, wherein said first and second side surfaces of said electro-optic material are made perpendicular to a central axis of said electro-optic material which corresponds to a light-traveling direction.

5. A voltage detector as claimed in claim 1, wherein said reflection means is a mirror made of a thin metal film.

6. A voltage detector as claimed in claim 4, wherein said electro-optic material has a uniform cross-sectional area taken perpendicularly to said central axis.

7. A voltage detector for detecting a voltage developing in a selected area of an object to be measured, comprising:
    a light source for emitting a light beam;
    a voltage sensing part including an electro-optic material whose refractive index changes according to said voltage developing in said selected area of said object, said electro-optic material having first and second sides surfaces made perpendicular to a central axis of said electro-optic material wherein said central axis corresponds to a light-travelling direction and said electro-optic material being an optically uniaxial material cut in such a manner that said first and second side surfaces of said electro-optic material are perpendicular to a direction which is inclined by approximately 55 degrees from a c-axis of said optically uniaxial electro-optic material, a reflection means disposed on said first side surface of said electro-optic material for reflecting an input light beam, and a transparent electrode disposed on said second side surface of said electro-optic material opposite to said first side surface;
    splitting and extracting means for extracting a light beam with a first predetermined polarized component from a light beam introduced from said light source, said light beam being launched into said electro-optic material as said input light, and for extracting an output light beam with a second predetermined polarized component from an output light beam emerging from said electro-optic material after reflecting from said reflection means; and
    detection means from determining said voltage developing in said selective area of said object on the basis of intensity of said output light beam with said second predetermined polarized component.

8. A voltage detector as claimed in claim 1, wherein an inner surface of said splitting and extracting means and an outer surface of said electro-optic material are provided with black coating.

* * * * *

UNITED STATES PATENT AND TRADEMARK OFFICE
CERTIFICATE OF CORRECTION

PATENT NO. : 4,996,475
DATED : February 26, 1991
INVENTOR(S) : Hironori Takahashi et al.

It is certified that error appears in the above-identified patent and that said Letters Patent is hereby corrected as shown below:

Claim 1, Column 7, Line 58, change "multi-layered dialectric" to --multilayered dielectric--;

Claim 7, Column 8, Line 37, after "second" change "sides" to --side--; and

Claim 7, Column 8, Line 60, after "means" change "from" to --for--.

Signed and Sealed this

Twenty-eighth Day of December, 1993

*Attest:*

BRUCE LEHMAN

*Attesting Officer*     *Commissioner of Patents and Trademarks*